(12) United States Patent
Nikoonahad et al.

(10) Patent No.: US 7,375,810 B2
(45) Date of Patent: May 20, 2008

(54) OVERLAY ERROR DETECTION

(75) Inventors: Mehrdad Nikoonahad, Menlo Park, CA (US); Guoheng Zhao, Milpitas, CA (US); Andrei V. Shchegrov, Campbell, CA (US); Ben Tsai, Saratoga, CA (US)

(73) Assignee: KLA-Tencor Corporation, San Jose, CA (US)

( * ) Notice: Subject to any disclaimer, the term of this patent is extended or adjusted under 35 U.S.C. 154(b) by 0 days.

(21) Appl. No.: 11/313,139

(22) Filed: Dec. 19, 2005

(65) Prior Publication Data
US 2006/0098199 A1    May 11, 2006

Related U.S. Application Data

(62) Division of application No. 09/697,025, filed on Oct. 26, 2000, now Pat. No. 7,009,704.

(51) Int. Cl.
*G01B 11/00* (2006.01)
*G06K 9/00* (2006.01)
(52) U.S. Cl. ........................ 356/401; 356/399; 382/151
(58) Field of Classification Search ...................... None
See application file for complete search history.

(56) References Cited

U.S. PATENT DOCUMENTS

| 4,662,753 | A | * | 5/1987 | Yabu .......................... 356/401 |
| 4,705,593 | A | * | 11/1987 | Haigh et al. ................. 438/708 |
| 4,728,193 | A | | 3/1988 | Bartelt et al. |

(Continued)

FOREIGN PATENT DOCUMENTS

JP    10-270347    10/1998

OTHER PUBLICATIONS

R. Pforr, et al., "In-Process Image Detecting Technique For Determination Of Overlay, And Image Quality For ASM-L Wafer Stepper", SPIE vol. 1674 Optical/Laser Microlithography V (1992) pp. 594-608.

(Continued)

*Primary Examiner*—Gregory J. Toatley, Jr.
*Assistant Examiner*—Gordon J. Stock, Jr.
(74) *Attorney, Agent, or Firm*—Davis Wright Tremaine LLP

(57) ABSTRACT

An overlay target with gratings thereon is illuminated and radiation scattered by the target is imaged onto detectors. A phase difference is then detected between the outputs of the detectors to find the mis-alignment error. In another aspect, an overlay target with gratings or box-in-box structures is illuminated and radiation scattered by the target is imaged onto detectors located away from the specular reflection direction of the illumination in a dark field detection scheme. Medium numerical aperture optics may be employed for collecting the radiation from the overlay target in a bright or dark field configuration so that the system has a larger depth of focus and so that the two structures of the target at different elevations can be measured accurately at the same time. Analytical functions are constructed for the grating type targets. By finding the phase difference between the two gratings at different elevations, misalignment errors can be detected. Analytical functions are constructed as a model for box-in-box type targets where data points away from the edges of the box or bars can be used in the curve fitting. Symmetrical functions are employed to further reduce noise.

35 Claims, 12 Drawing Sheets

U.S. PATENT DOCUMENTS

| | | | |
|---|---|---|---|
| 4,871,955 A | | 10/1989 | Berger |
| 5,000,573 A | * | 3/1991 | Suzuki et al. ............... 356/490 |
| 5,130,554 A | | 7/1992 | Nose et al. |
| 5,182,610 A | * | 1/1993 | Shibata ...................... 356/490 |
| 5,216,257 A | | 6/1993 | Brueck et al. |
| 5,333,050 A | | 7/1994 | Nose et al. |
| 5,343,292 A | | 8/1994 | Brueck et al. |
| 5,465,148 A | * | 11/1995 | Matsumoto et al. ........ 356/490 |
| 5,495,336 A | | 2/1996 | Nose et al. |
| 5,585,923 A | * | 12/1996 | Nose et al. ................. 356/490 |
| 5,610,718 A | * | 3/1997 | Sentoku et al. ............ 356/490 |
| 5,682,239 A | * | 10/1997 | Matsumoto et al. ........ 356/488 |
| 5,712,707 A | | 1/1998 | Ausschnitt et al. |
| 5,751,426 A | * | 5/1998 | Nose et al. ................. 356/488 |
| 5,757,507 A | | 5/1998 | Ausschnitt et al. |
| 5,808,742 A | | 9/1998 | Everett et al. |
| 5,847,974 A | * | 12/1998 | Mori et al. .................. 702/94 |
| 5,917,604 A | * | 6/1999 | Dirksen et al. ............ 356/401 |
| 5,923,041 A | | 7/1999 | Cresswell et al. |
| 6,023,338 A | | 2/2000 | Bareket |
| 6,130,750 A | | 10/2000 | Ausschnitt et al. |
| 6,317,211 B1 | * | 11/2001 | Ausschnitt et al. ......... 356/401 |
| 6,556,305 B1 | | 4/2003 | Aziz et al. |
| 6,710,876 B1 | * | 3/2004 | Nikoonahad et al. ....... 356/401 |

OTHER PUBLICATIONS

"Microinterferometre differentiel a ondes polarises," G. Nomarski, J. Phys Radium 16, (S-13S (1955).

"Lithography Process Control," H. Levinson, SPIE press, vol. TT28, Bellingham, Washington, 1999.

International Preliminary Examination Report for corresponding PCT application No. PCT/US01/51287 dated May 30, 2003, 8 pages.

Written Opinion for corresponding PCT application No. PCT/US01/51287 dated Dec. 31, 2002, 7 pages.

Notification of the Transmittal of the International Search Report or the Declaration for corresponding PCT application No. PCT/US01/51287 dated Aug. 16, 2002, 6 pages.

Japanese Patent Office, "Notification of Reasons for Refusal," dispatch date in related patent application 2004-521380 on Nov. 27, 2007, 9 pgs.

Amended Claims for Japanese Patent Application No. 2004-521380, Oct. 26, 2004, 12 pgs.

* cited by examiner

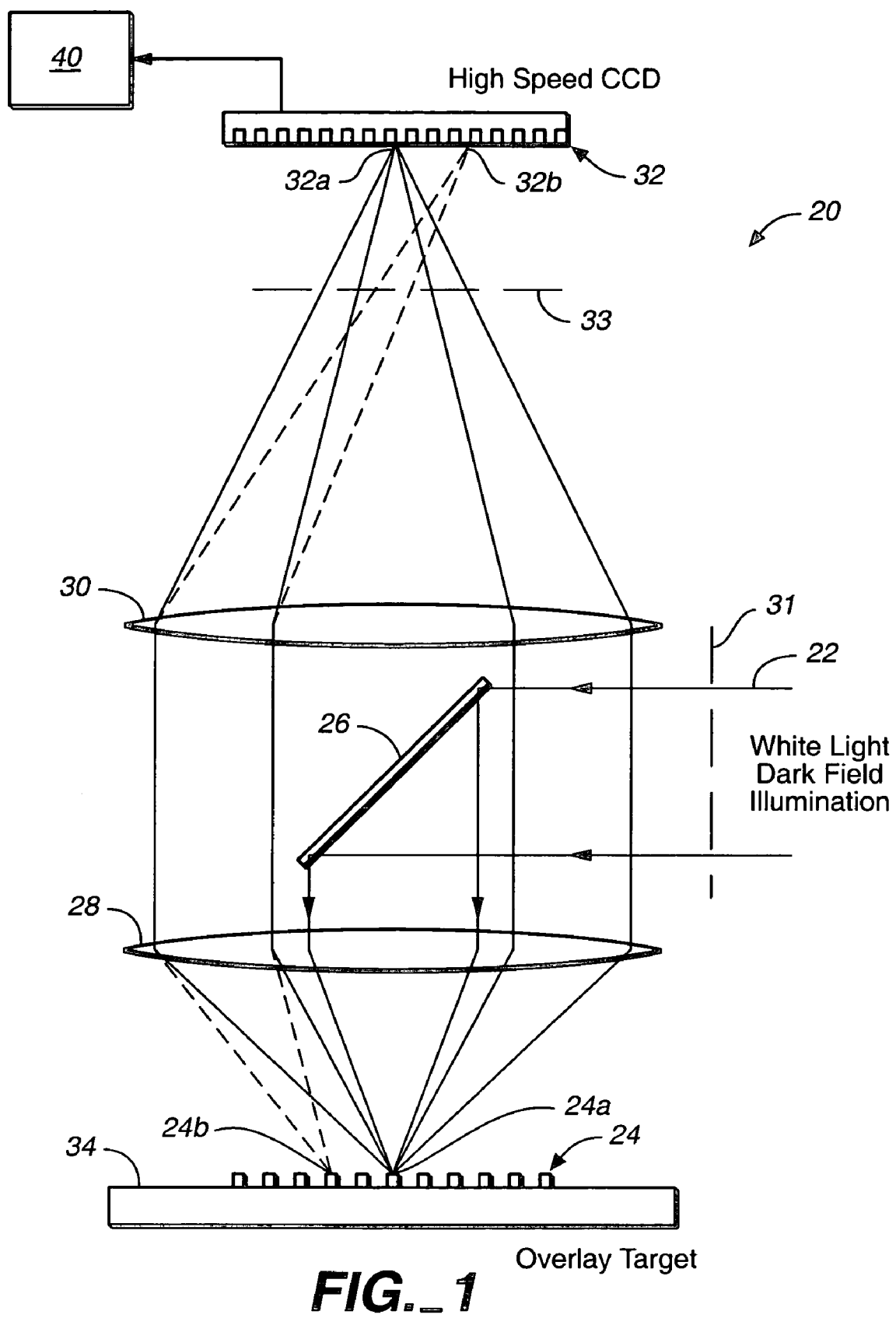
FIG._1

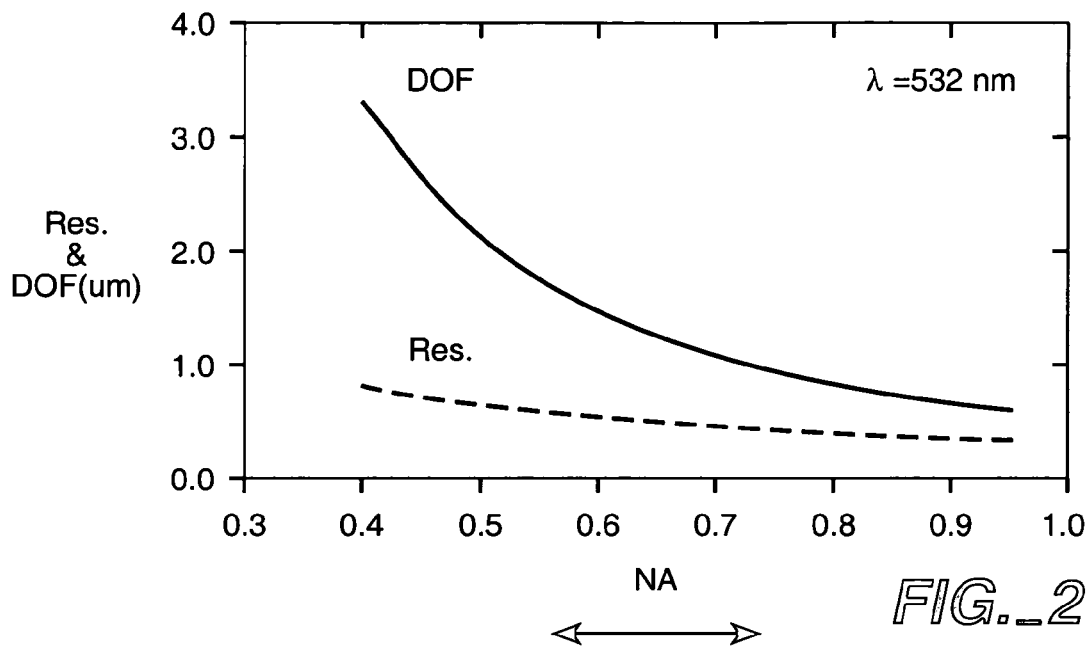
FIG._2
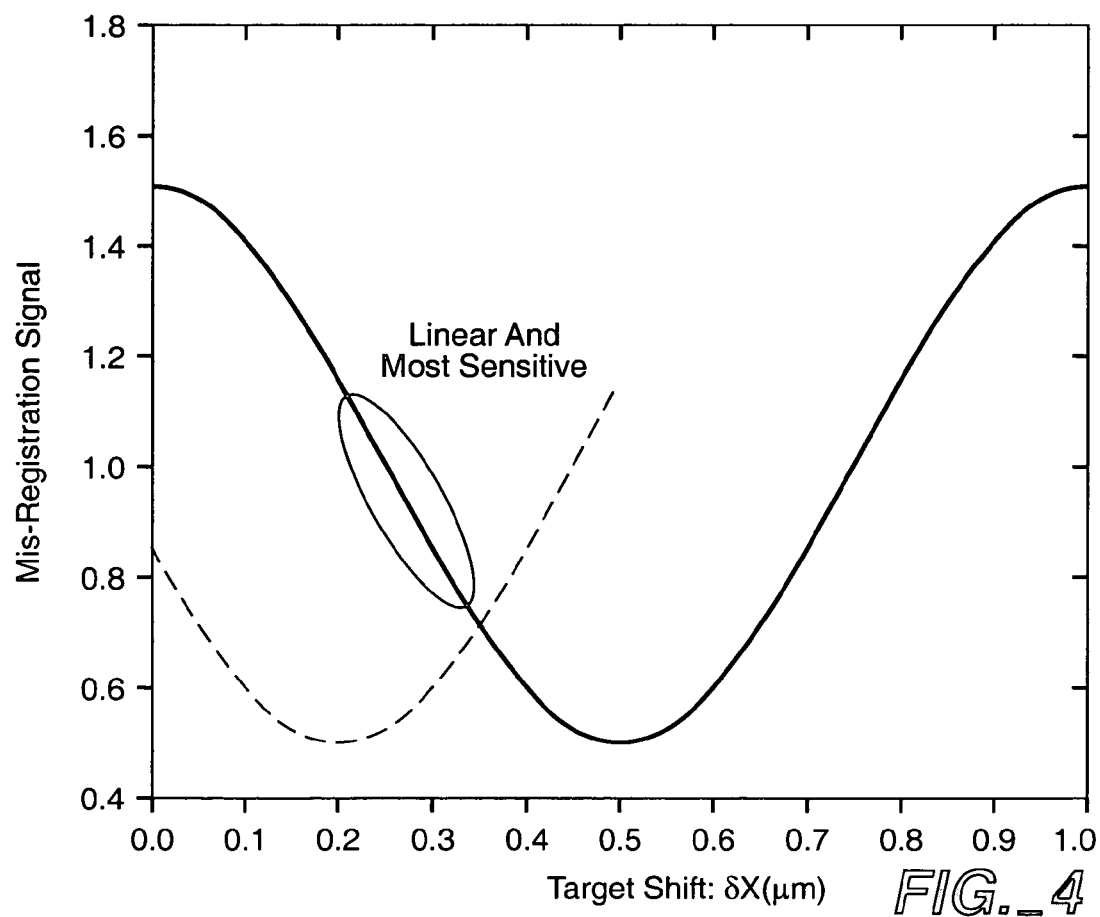
FIG._4

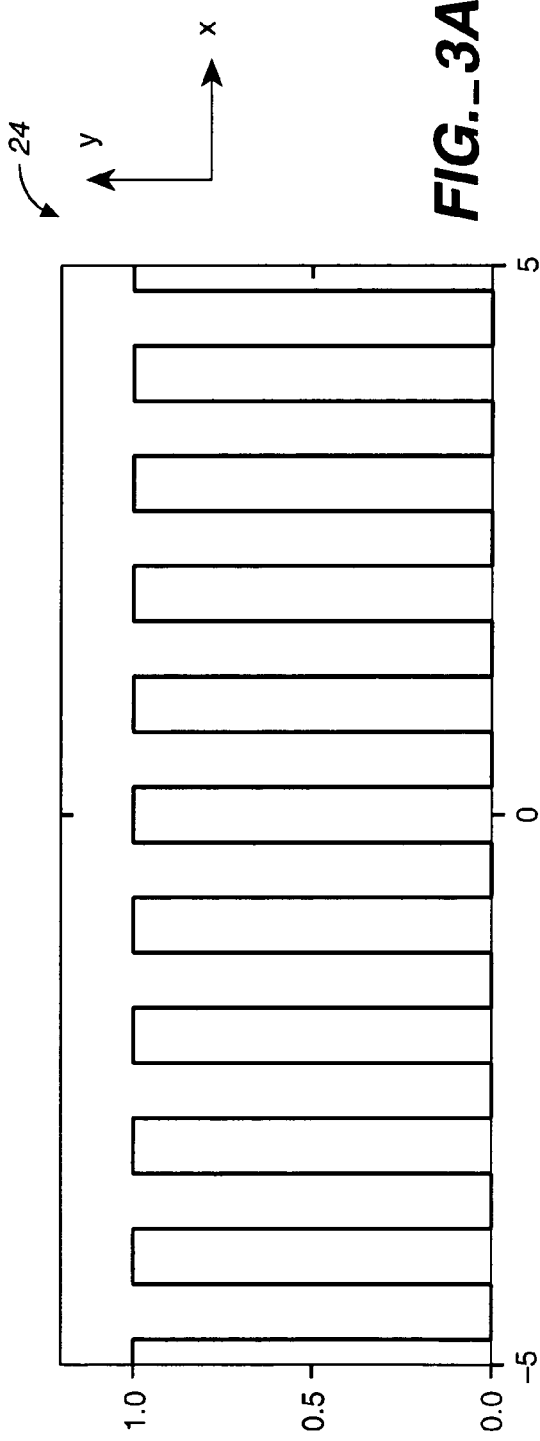
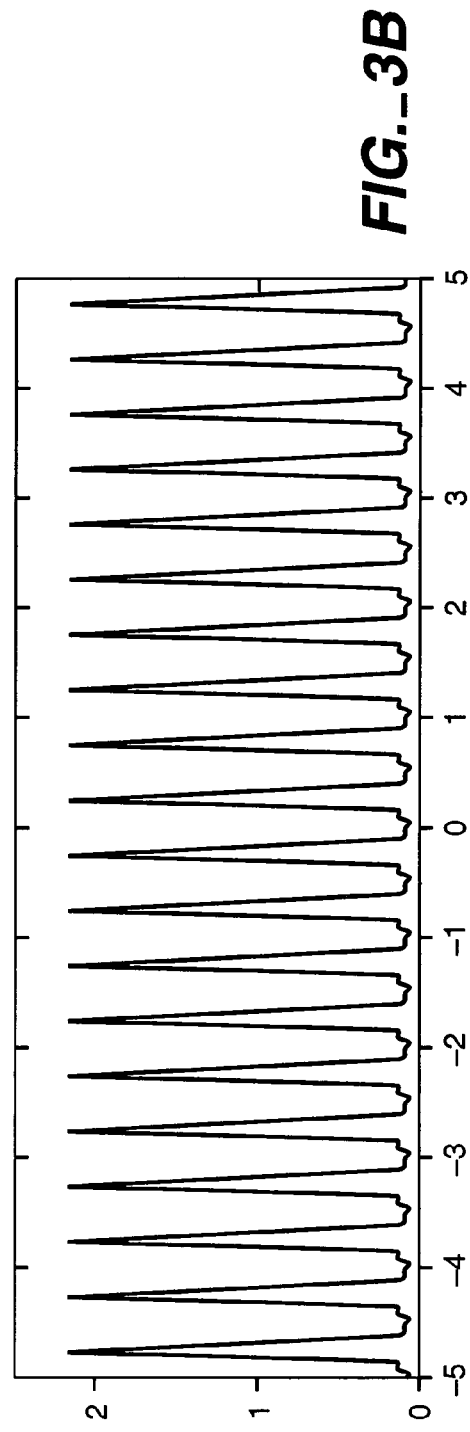
FIG._3A
FIG._3B

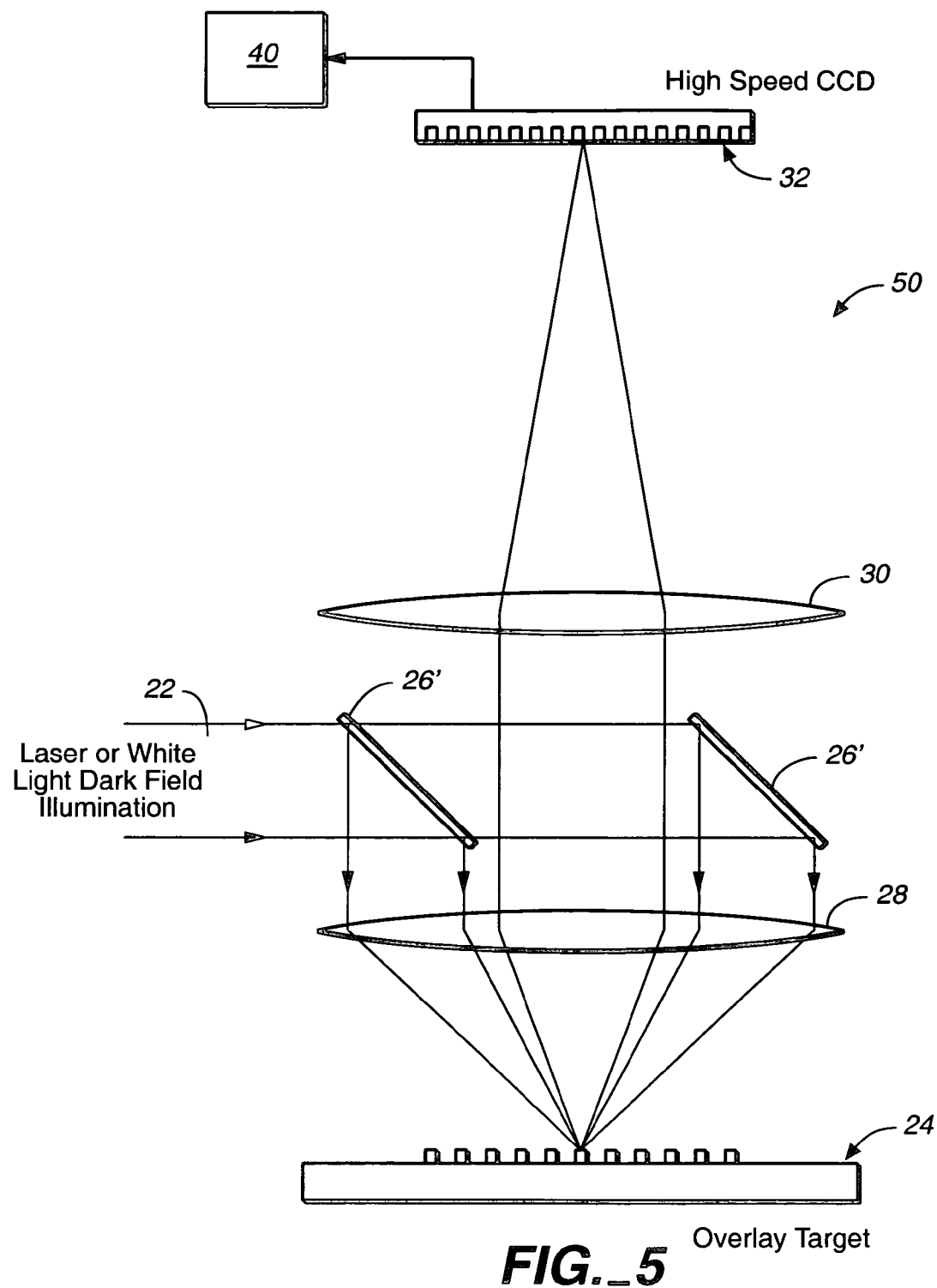

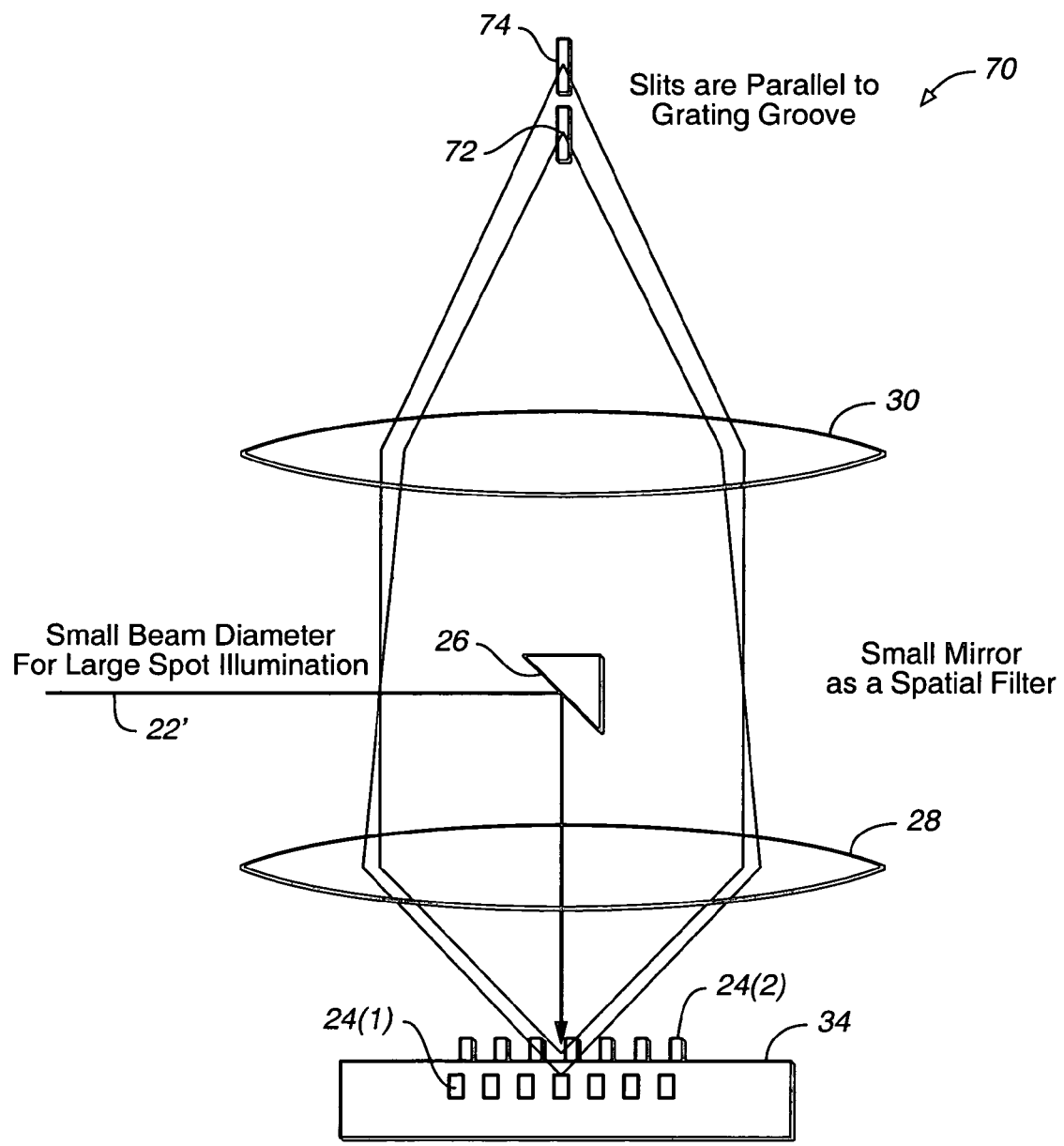
FIG._6A

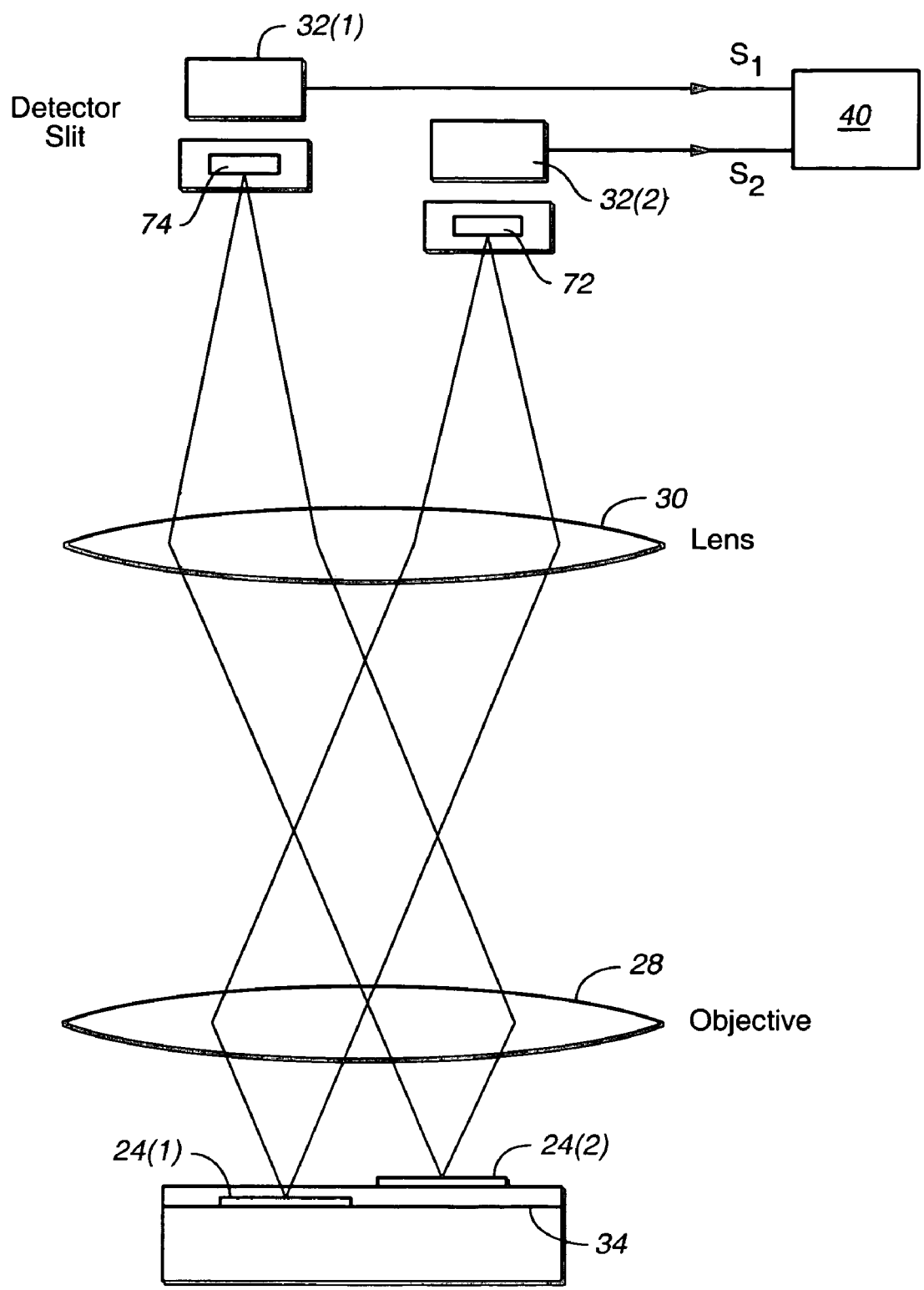
FIG._6B

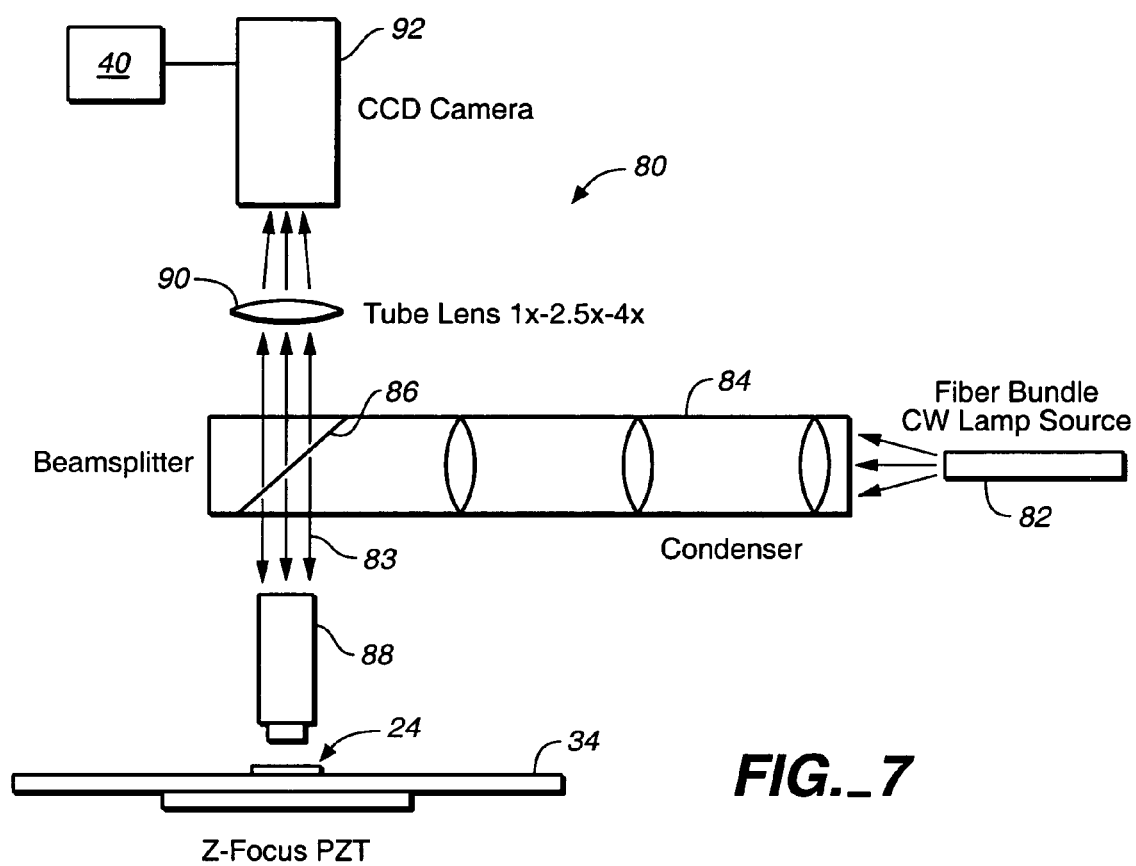
FIG._7

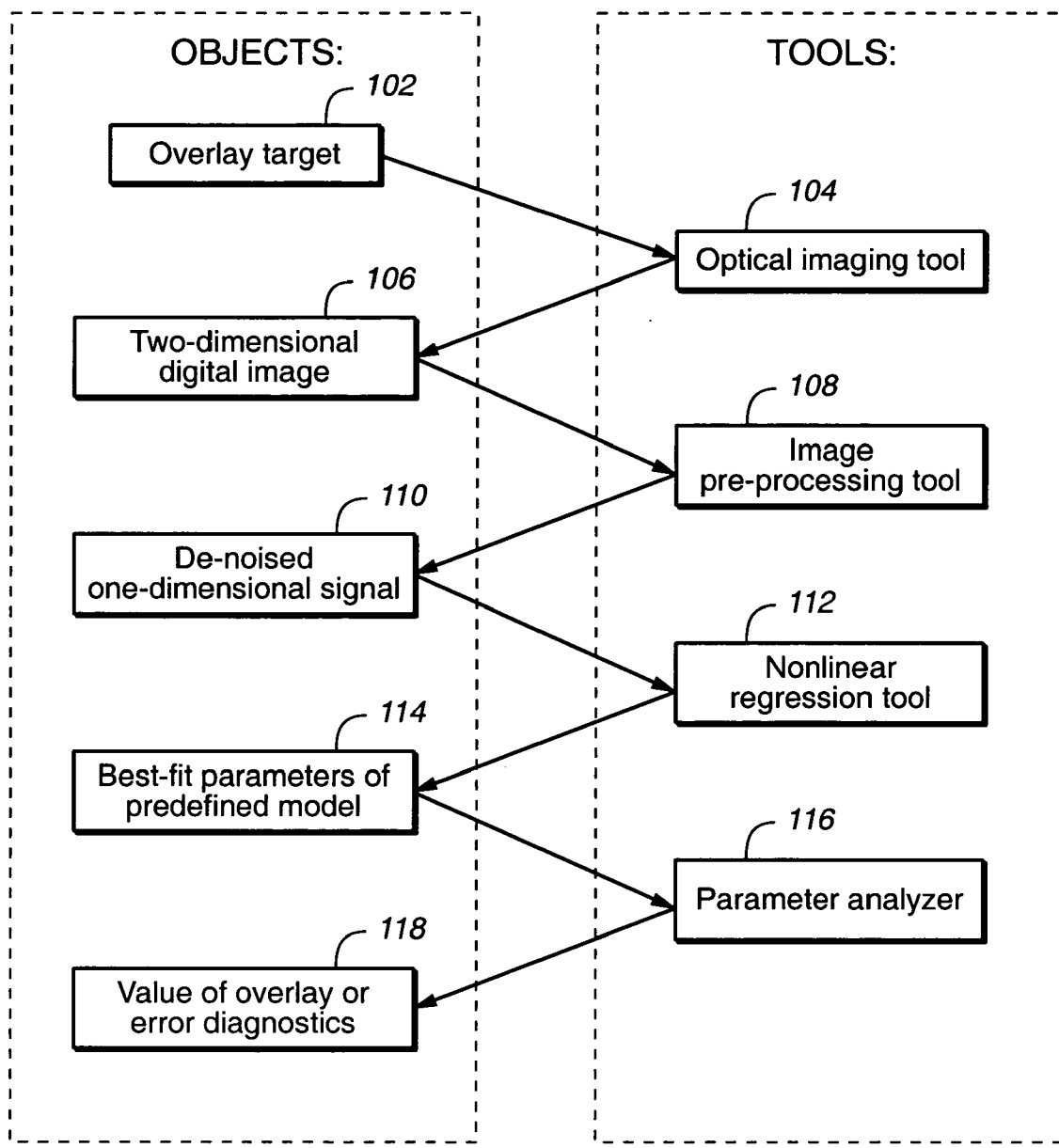
FIG._8

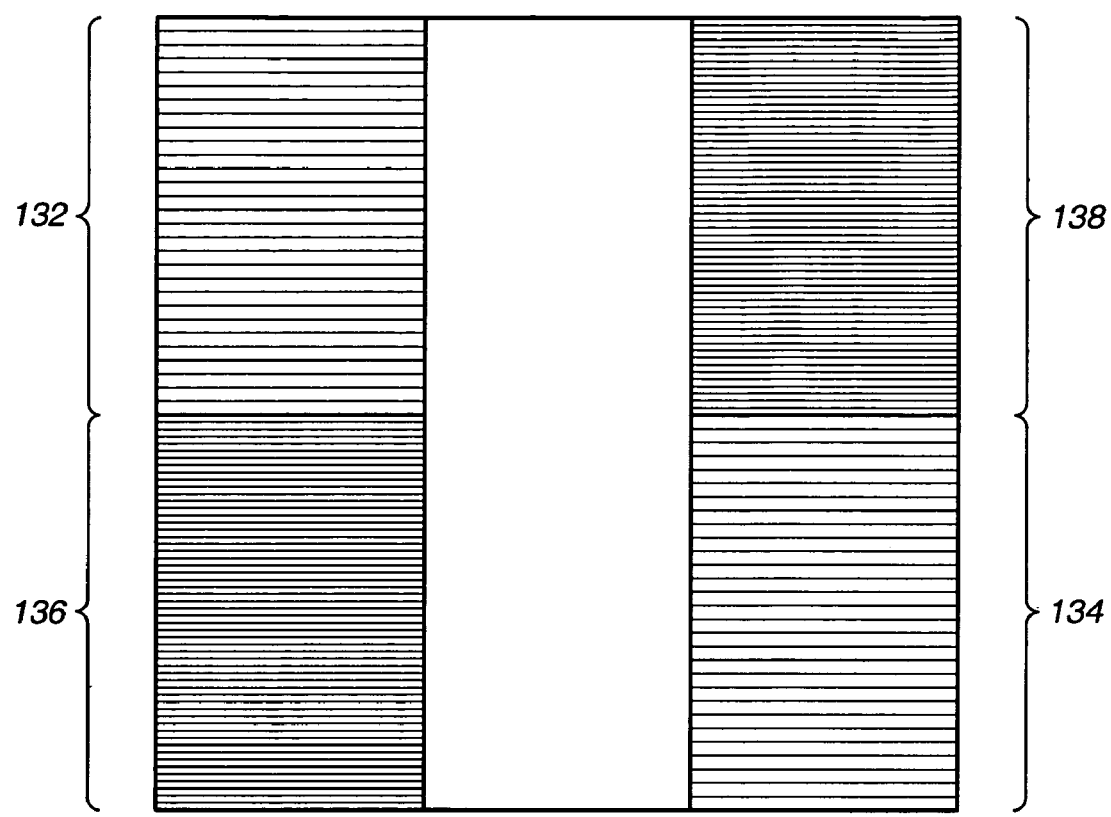
FIG._9
FIG._10

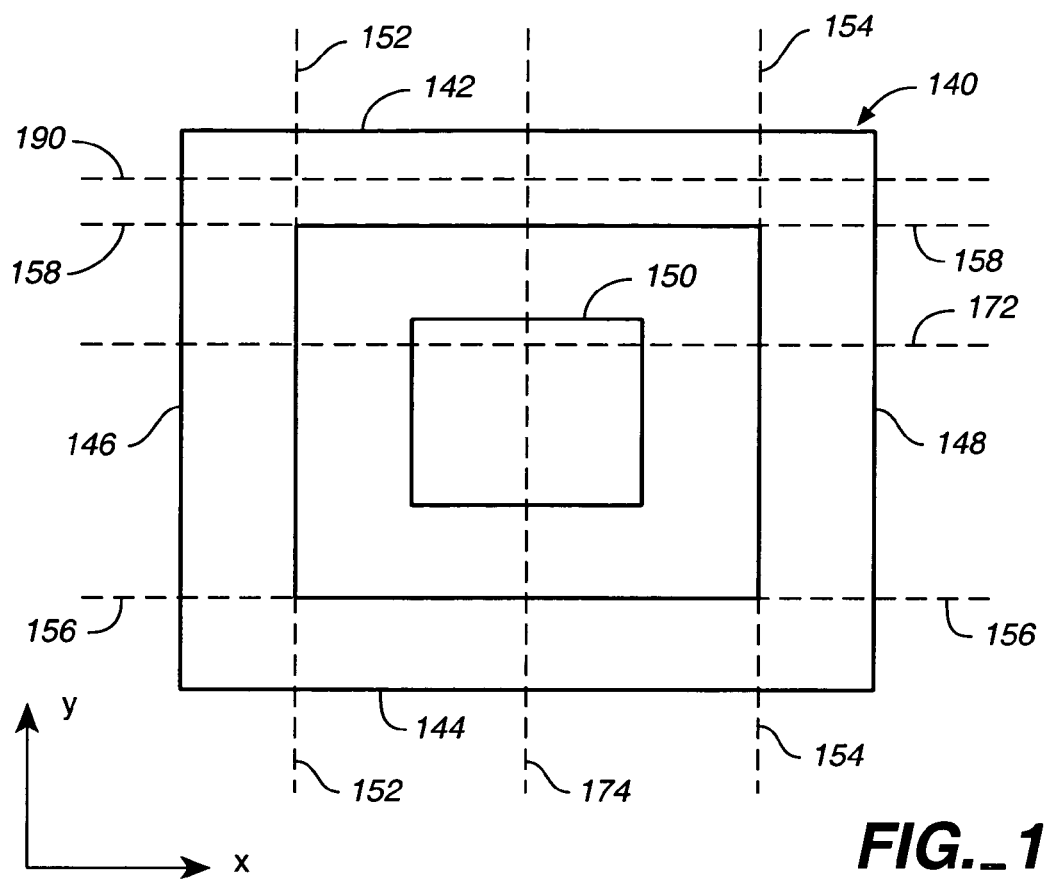
FIG._11
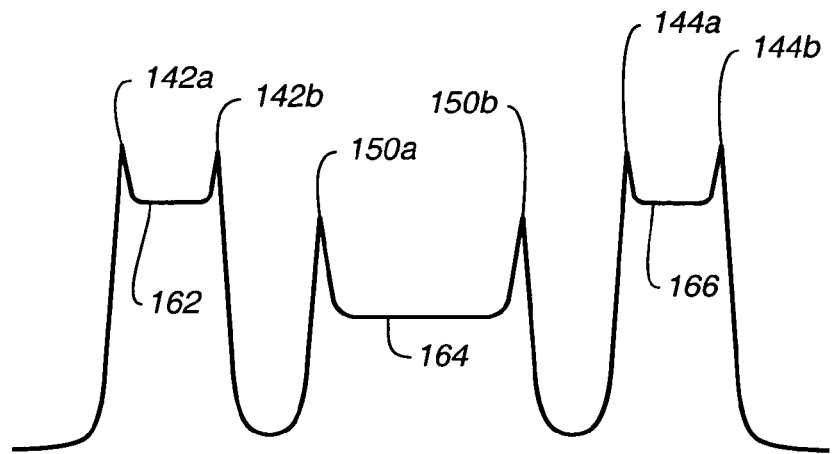
FIG._12

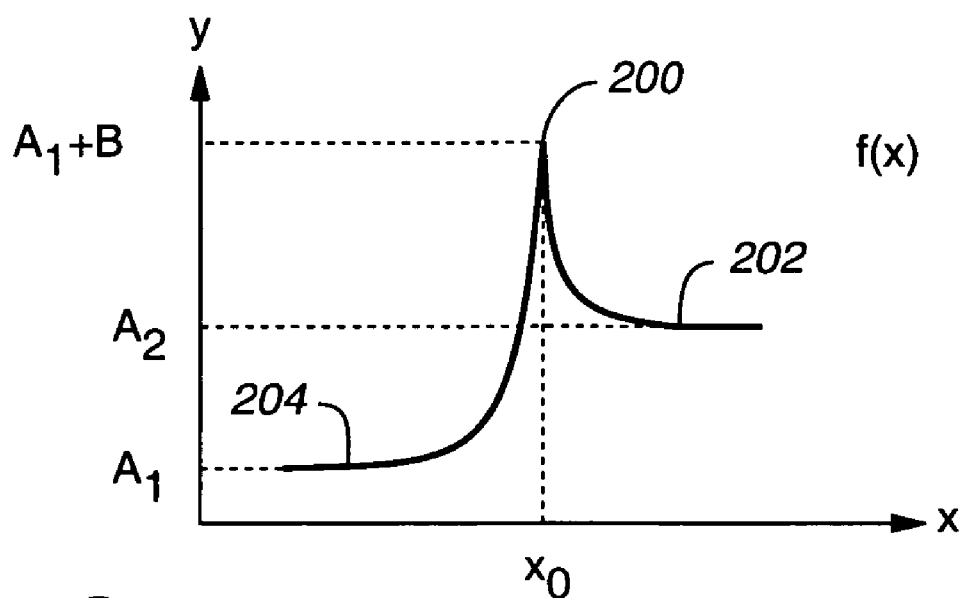
FIG._13
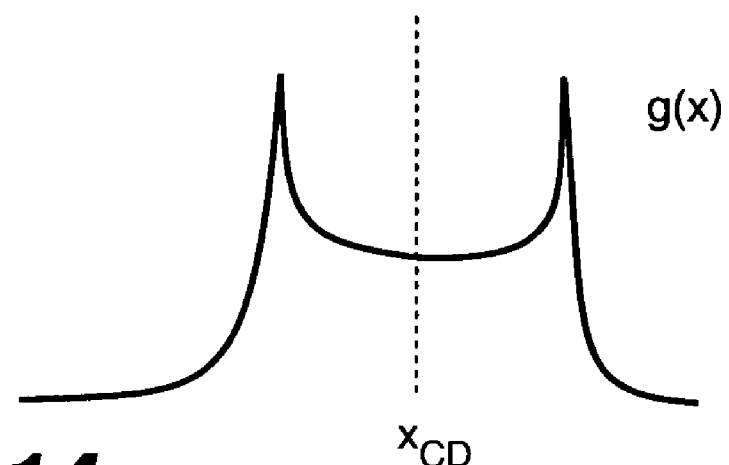
FIG._14

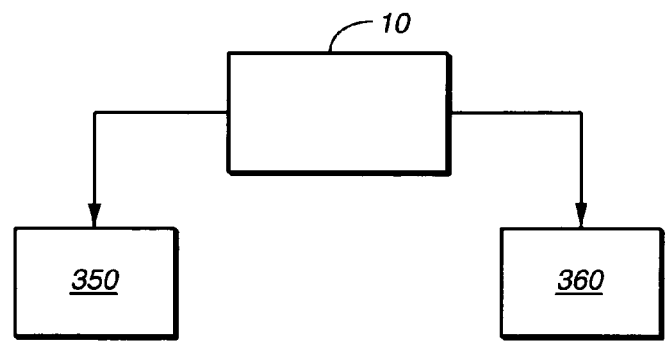
FIG._15
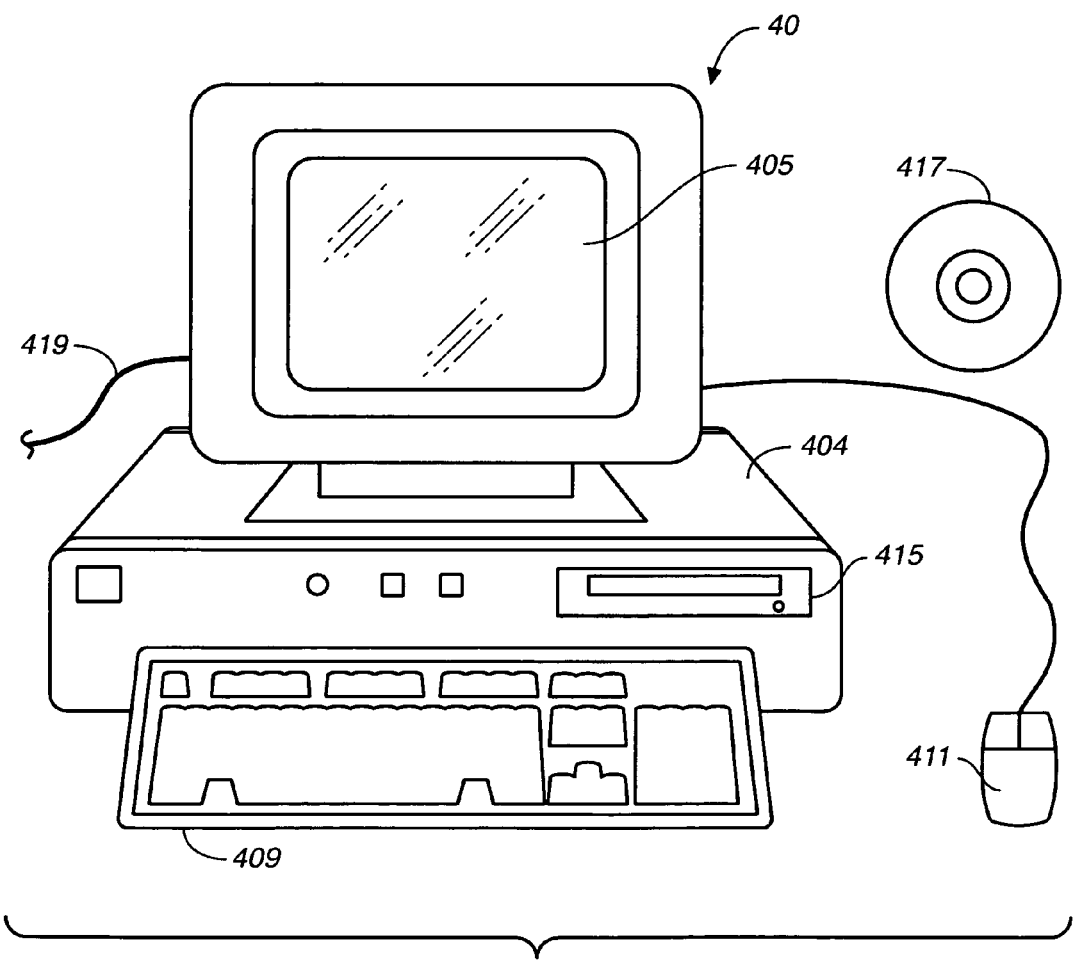
FIG._16

OVERLAY ERROR DETECTION

CROSS-REFERENCE TO RELATED APPLICATION

This application is a division of application Ser. No. 09/697,025, filed Oct. 26, 2000, now U.S. Pat. No. 7,009,704; which application is incorporated by reference as if fully set forth herein.

BACKGROUND OF THE INVENTION

This invention relates in general to overlay error detection and, in particular, to an imaging system for detecting misalignment of two structures and methods for determining overlay errors.

Overlay error measurement requires specially designed targets to be strategically placed at various locations, normally in the street area between dies, on the wafers for each process. The alignment of the two overlay targets from two consecutive processes is measured for a number of locations on the wafer and the overlay error map across the wafer is analyzed to provide misalignment information. This information may then be used for the alignment control of wafer processing equipment.

A key process control parameter in the manufacturing of integrated circuits is the measurement of overlay target alignment between successive layers on a semiconductor wafer. If the two overlay targets are misaligned relative to each other, the electronic devices fabricated will malfunction and the semiconductor wafer will need to be reworked or discarded.

Typically, conventional overlay targets are box-in-box targets and bar-in-bar targets. A box-in-box target typically has a 10 μm inner box and a 20 μm outer box. The outer box is printed on the substrate (or previous process layer) and the inner box is resist printed on the current layer. Overlay error is reported as the mis-position of the inner box with respect to the outer box. A bar-in-bar target also has a 10 μm inner target on the current layers and a 20 μm outer target on the previous layers. However, the box edge is replaced with a narrow bar approximately 2 μm wide. The box-in-box targets are more compact; however, the bar-in-bar targets provide better measurement performance. Overlay targets may comprise grating structures on top of the wafer or etched into the surface of the wafer. For example, one overlay target may be formed by etching into the wafer while another adjacent overlay target may be a photoresist layer at a higher elevation over the wafer.

Conventional systems for detecting overlay target misalignment typically employ an electronic camera that images the "box-in-box" or "bar-in-bar" target. The accuracy of the conventional system is limited by the accuracy of the line profiles in the target, by aberrations in the illumination and imaging optics and by the image sampling in the camera. Such methods are complex and they require full imaging optics. Vibration isolation is also required and it may be difficult to integrate such systems into process equipment, such as a track. Conventional methods for overlay error detection have difficulties with low contrast targets, such as those obtained by chemical and mechanical polishing processes.

An improvement to the conventional method is described in U.S. Pat. No. 6,023,338. This patent discloses a method where two overlay target structures are placed next to each other and two radiation beams illuminating spots on the structures are scanned along two separate paths across portions of both structures. The intensity of the radiation reflected along both paths are detected and processed to calculate any offset between the two structures.

None of the above-described methods and techniques are entirely satisfactory. It is, therefore, desirable to develop an improved system with better performance and simplified characteristics.

SUMMARY OF THE INVENTION

One aspect of this invention is based on the observation that, instead of scanning light beams across a target, at least a portion of two periodic structures in the target may be imaged onto an array of detectors. Misalignment between the two structures may then be determined from the outputs from the detectors. This aspect of the invention is particularly useful when integrated into semiconductor processing equipment, such as steppers and etchers. When so integrated, any system for detecting overlay errors is subject to vibrations. If the detection system requires scanning light beams across targets, vibrations may cause the position of the beams to shift over time. By imaging portions of the two structures onto an array of detectors, all of the data used for determining misalignment between the structures are obtained at the same time so that the system is less affected by vibrations. Preferably, the misalignment between the two structures is determined from a phase difference between the outputs of the detectors.

Conventional methods for measuring overlay errors employ high numerical aperture objectives for collecting light from two target structures, where high numerical aperture objectives are used to maximize the resolution and hence the edge definition. The target structures may include an inner box at a higher elevation compared to the outer box. Since the collection objective employed in conventional methods has a high numerical aperture, this necessarily means that it has a small depth of focus. Thus, if the objective is positioned so that radiation from the inner box is focused onto the detector, then light collected from the outer box at a lower elevation will be out of focus with respect to the detector. Hence, in order to accurately measure both the inner and outer boxes, it is necessary to measure the target twice, known in the field as "double grab" with different optical focuses, so that radiation from both the inner and outer boxes may be focused onto the detector. Since two measurements are required instead of one as in a "single grab" measurement, this adversely affects throughput and is disadvantageous. Furthermore, where the detection system is subject to vibrations, such as in a wafer processing environment, vibrations may cause the optical alignment to shift between the two measurements, which may result in errors in the overlay error measurement. According to another aspect of the invention, the collection objective has a medium numerical aperture and therefore a larger depth of focus. Hence this increases the likelihood that radiation from both the inner and outer boxes or other structures at different elevations will be adequately focused onto corresponding detectors simultaneously so that there is no need to measure the target twice. Therefore, there are more applications where single grab is possible so that throughput is not adversely affected for such applications. Furthermore, since a medium numerical aperture increases the odds for adequate information to be obtained for overlay error measurement in one measurement, the system is robust and less affected by vibrations.

The above-described problem of conventional systems can be overcome in another aspect of the invention by employing two apertures and optics that focus radiation collected from one structure to one aperture and that focuses radiation collected from the other structure to a different aperture. The detector or detectors would then detect radiation passing through the apertures. In this manner, both structures can be focused to the detector(s) and their corresponding apertures simultaneously.

In an environment where the collection system is subject to vibrations, the measurement accuracy will be adversely affected by the vibrations if the data collection is over a time period where the optical alignment changes over such time period. For this reason, preferably one or more detectors are employed to detect the collected radiation where the detector (s) has an integration time less than about 10 milliseconds. When the integration time of the detector(s) is set to be in such range of values, the detection system will be less affected by vibrations such as those encountered in a wafer processing environment.

Instead of setting the integration time of detectors to be short compared to the periods of the vibrations encountered by the system, alternatively, the two structures may be illuminated by radiation pulses having a pulse width that is less than the periods of vibrations, such as a pulse width of less than 10 milliseconds. Alternatively, mechanical shutters may be used on the illumination optics (shown in dotted line 31 in FIG. 1) or collection optics (shown in dotted line 33 in FIG. 1) of the system, where the aperture time (time periods during which the shutter is open) of the shutter is less than 10 milliseconds.

One or more of the above-described systems may be integrated into processing equipment such as a lithographic track or stepper or an etcher to form an integrated tool. The above-described systems can be a bright field or a dark field system (defined below). In a bright field system, the radiation collected from the two structures includes that along specular reflection direction or directions; however, depending on the optics employed, in addition to collecting radiation along the specular reflection direction(s), radiation may also be collected along directions away from the specular reflection direction(s) in a bright field system.

According to another aspect of the invention, radiation that is imaged onto the array of detectors is collected only along one or more directions away from the specular reflection direction(s) for the reason that such detection suppresses low spatial frequency components and brings up high spatial frequencies, which increases the edge detection capability and hence the sensitivity in the overlay error measurement. A detection system employing such collection (collecting only along one or more directions away from the specular reflection direction(s)) is referred to as a dark field system, which is useful for measuring overlay errors of periodic type targets such as gratings, as well as targets employing box(es) and bar(s), such as box-in-box and bar-in-bar type targets. Dark field systems are particularly useful for measuring overlay errors in low contrast targets, such as where the difference in elevation between the inner and outer boxes is small.

Other aspects of the invention relate to processing of radiation data collected from the two structures of the target. After a two-dimensional image of the target has been obtained, at least one one-dimensional signal may be derived from the image and used for determining an overlay error between the two structures. Where the one-dimensional signal is derived by averaging data in the image, the signal-to-noise ratio may be improved.

In conventional processing of data in overlay error detection, only data in portions of images at or close to edges of objects such as boxes or bars are used and the system is strongly dependent on the quality and contrast of the images. Modern chemical mechanical polishing processes tend to reduce the contrast of the target so that conventional methods may no longer be adequate. According to another aspect of the invention, the two-dimensional image of the target is represented by at least one signal which is an analytical function of position in the image. A curve fitting process of the at least one signal to data from the image of the two structures is then preferably used to determine an overlay error. When the image of the two structures is represented by at least one signal which is an analytical function, more information from the two-dimensional image is used for finding overlay errors compared to conventional methods and yields more accurate results. The curve fitting process further improves detection accuracy and precision.

Any of the techniques for processing the image in overlay misalignment detection described above may be performed by means of software components loaded into a computer or any other information appliance or digital device. When so enabled, the computer, appliance or device may then perform the above-described techniques to assist the finding of overlay misalignment. The software component may be loaded from a fixed media or accessed through a communication medium such as the internet or any other type of computer network.

BRIEF DESCRIPTION OF THE DRAWINGS

FIG. 1 is a cross-sectional view of a laser or white light dark field system to illustrate an embodiment of the invention.

FIG. 2 is a graphical plot of resolution and depth of focus versus objective numerical aperture to illustrate and embodiment of the invention.

FIG. 3A is a cross-sectional view of a portion of a grating target useful for illustrating the invention.

FIG. 3B is a graphical plot of the intensity of the radiation scattered by the grating target of FIG. 3A, using the system of FIG. 1 to illustrate an embodiment of the invention.

FIG. 4 is a graphical plot of a mis-registration signal between the two gratings of the target versus target shifts between the two gratings useful for illustrating the invention.

FIG. 5 is a cross-sectional view of a laser or white light dark field system to illustrate another embodiment of the invention.

FIG. 6A is a cross-sectional front view of a laser dark field system with dual slit or aperture scanning to illustrate another embodiment of the invention.

FIG. 6B is a side view of the system of FIG. 6A.

FIG. 7 is a bright field imaging system having collection optics with medium numerical aperture for detecting misalignment of two periodic structures in the target to illustrate still one more embodiment of the invention.

FIG. 8 is a flow chart illustrating a process for obtaining a two-dimensional image of an overlay target and the processing of the image to obtain misalignment information concerning structures in the overlay target to illustrate an embodiment of the invention.

FIG. 9 is a two-dimensional grating image useful for illustrating the invention.

FIG. 10 is a graphical plot of two one-dimensional signals that are derived from a two-dimensional image, such as that of FIG. 9, to illustrate an aspect of the invention.

FIG. 11 is a two-dimensional box-in-box image useful for illustrating the invention.

FIG. 12 is a graphical plot of a one-dimensional data signal derived from an image of a box-in-box target to illustrate another aspect of the invention.

FIG. 13 is a graphical plot of an analytical function as an approximation of an edge portion of a box-in-box or bar-in-bar, or box-in-bar type image useful for illustrating the invention.

FIG. 14 is a graphical plot of an analytical function derived from the edge portions of an outer box image useful for illustrating the invention.

FIG. 15 is a block diagram of a system for detecting misalignment between structures in a target, where the system is connected to a lithographic track, stepper and/or an etcher, either as a stand alone instrument or as an integrated tool with the stepper and/or the etcher to illustrate another aspect of the invention.

FIG. 16 is a block diagram showing a representative sample logic device in which aspects of the present invention may be embodied.

For simplicity in description, identical components are labeled by the same numerals in this application.

DETAILED DESCRIPTION OF THE EMBODIMENTS

FIG. 1 is a cross-sectional view of a polychromatic (e.g. white light) or laser dark field imaging system to illustrate one embodiment of the invention. As shown in FIG. 1, the imaging system 20 includes a source (not shown) which supplies a laser beam 22 or a beam 22 of polychromatic radiation such as white light, where the beam 22 is reflected by a mirror 26 towards overlay target 24. Target 24 has two structures thereon: one on a current layer at a higher elevation than the other one on a previous layer. The two structures may be two gratings (they can also be the type that includes box(es) or bar(s), though not shown as such in FIG. 1), located on two different planes and are substantially parallel to the planes, where one of the two planes such as plane 34 (or any plane parallel thereto) may serve as a reference plane. Radiation from beam 22 that has been scattered by target 24 is collected by lens 28 and focused by lens 30 towards an array of detectors 32.

In FIG. 1, radiation from beam 22 is reflected by mirror 26 along directions that are normal to or near normal to reference plane 34. Radiation from the beam 22 scattered by the illuminated portion 24a of target 24 is collected by lens 28 and focused by lens 30 to a corresponding area 32a on array 32 along directions that are oblique to reference plane 34. While only one small portion 24a of target 24 is shown to be illuminated by beam 22 in FIG. 1, in actual fact, a much larger area of target 24 is illuminated by beam 22. In other words, an image of the large illuminated area of target 24 is formed on detector array 32. For example, in addition to portion 24a shown as illuminated in FIG. 1, another portion 24b is also illuminated by beam 22 also along directions that are normal to or near normal to reference plane 34, although this is not shown as such in FIG. 1, so that the radiation from beam 22 scattered by portion 24b will also be collected by lens 28 along directions oblique to plane 34 and focused by lens 30 onto corresponding area 32b on detector array 32. This is illustrated in dotted lines in FIG. 1.

Radiation scattered by target 24 in specular reflection directions normal or near normal to plane 34 are blocked from array 32 by mirror 26, which serves as a stopper. Therefore, system 20 is a dark field system. Radiation from beam 22 and scattered by other portions similar to portions 24a, 24b of target 24 may also be collected and focused in a similar manner to illuminate corresponding portions of array 32. In this manner, an image of the illuminated area on target 24 is formed on array. Preferably, beam 22 illuminates the entire extent of two structures on target 24, so that the images of the two structures formed on array 32 would yield enough information for overlay misalignment error detection. However, it may be adequate for only portions and not the entire extent of the two structures of target 24 to be illuminated, where the information yielded by detection of radiation scattered by the illuminated portions is enough for overlay error detection. Therefore no relative motion between beam 22 and target 24 is required for the error detection, and there may be less need to perform sequential measurements, unlike prior art systems. A typical size of the area illuminated by beam 22 is about 100 by 100 microns.

In one embodiment illustrated in FIG. 1, the two structures on overlay target 24 include two gratings placed side by side where the two gratings are periodic along the same direction. An image of at least a portion of each of the two gratings is formed on detector array 32. By processing the images so formed, a misalignment between the two gratings can be detected.

System 20 is advantageous over that described in U.S. Pat. No. 6,023,338 in that no relative motion between the overlay target and any optics is required. Thus, there are no moving parts in system 20, and all the information required for determining misalignment between the two gratings is obtained simultaneously. For this reason, system 20 is particularly advantageous when integrated with processing equipment, such as a lithographic track, stepper an etcher. When so integrated, system 20 is subject to vibrations. When an overlay error detection system requires scanning, this means that data acquired is taken sequentially over time. Vibrations caused by semiconductor wafer processing may cause the alignment of the optics with respect to the overlay target 24 to change over time, thereby introducing errors in the measurements. Since there are no moving parts in system 20 and it is likely that all of the data required to determine misalignment can be obtained simultaneously, the measurement using system 20 is less affected by vibrations caused by wafer processing.

Illumination beam 22 may be polychromatic, such as that provided by a white light source. While a beam 22 is shown in FIG. 1, any flood illumination scheme is possible and may be used in system 20 to provide adequate illumination and to enhance signal-to-noise ratio.

As noted above, conventional overlay error detection systems employ optics with high numerical aperture. The two gratings (only one of which is shown in FIG. 1) on target 24 are typically at different elevations. When high numerical aperture optics is placed to focus radiation from the structure at one elevation towards the detector, this means that the radiation from the other structure will be out of focus at the detector. For this reason, it may be desirable to employ optics with lower numerical aperture so that the optics will have a larger depth of focus and is, therefore, more tolerant of the difference in elevation between the two structures in the overlay target. When the numerical aperture is reduced, however, so is also the resolution of the optics. FIG. 2 illustrates a correlation between numerical aperture and resolution based on calculations. Thus, as shown in FIG. 2, the depth of focus decreases with an increase in numerical aperture. The same is true of resolution, except that the decrease is much more gradual compared to the depth of focus. Thus, in one embodiment, the numerical aperture chosen is in the range 0.1 to 0.9. More preferably, the numerical aperture is within the range of about 0.4 to 0.8. Even more preferably, the numerical aperture of the optics (e.g. lenses 28 and 30) is within the range of about 0.5 to 0.7. Within such ranges, system 20 has a depth of focus which is more tolerant of the elevation difference between the two structures, while achieving an acceptable resolution at the same time. In this manner, by using such optics of lower numerical aperture, acceptable results can be obtained by only one measurement of both structures at different elevations. There is therefore no need for two measurements at different focii to be performed, unlike in conventional systems. This is the case for both dark field systems and bright field systems (such as that in FIG. 7 described below).

As noted above, conventional overlay error detection is strongly dependent on the quality and contrast of the images. Modern chemical mechanical polishing tends to reduce the contrast of the target. To suppress low spatial frequency components and accentuate the details such as edges in the image by amplifying high spatial frequencies on detector array 32, dark field detection may be employed. This will enhance sensitivity in the overlay error estimation algorithm. This is illustrated in FIGS. 3A, 3B. FIG. 3A is the cross-sectional view of a portion of a grating on target 24. FIG. 3B is a graphical plot of an image of radiation scattered by the grating in FIG. 3A plotted as a function of position, obtained using a dark field system such as that shown in FIG. 1. FIGS. 3A, 3B are aligned in position so that, as shown in FIG. 3B, the peak intensities are the scattered radiation corresponding to the edges of the grating. First, as clearly shown in FIGS. 3A, 3B, the dark field detection system of FIG. 1 accentuates the high spatial frequencies occurring at the edges of the grating and suppresses the lowest spatial frequency components, thereby improving signal-to-noise ratio for edge detection.

Dark field detection may be employed for both the targets with gratings thereon as well as the box-in-box, bar-in-bar, box-in-bar or bar-in-box type targets to obtain the above-described advantages. Thus, when dark field detection is applied to the latter type of targets with structures including boxes and bars, graphical plots similar to FIG. 3B will be obtained, where again low spatial frequency components are suppressed and the details of the image such as edges are accentuated by amplifying high spatial frequencies. Dark field systems are particularly useful for measuring overlay errors in low contrast targets, such as where the difference in elevation between the inner and outer boxes (or two gratings) is small.

FIG. 4 is a graphical plot of the mis-registration signal as a function of the target shift or mis-alignment between the two gratings on target 24. As shown in FIG. 4, it will be observed that the mis-registration signal detected by detector array 32 varies as a function of the target shift, where the signal is linear and the most sensitive within a certain range of the target shift.

FIG. 5 is a cross-sectional view of a dark field overlay error detection system to illustrate another embodiment of the invention. In system 20 of FIG. 1, the illumination is directed towards the target from an overhead position (i.e. in directions normal or near normal to reference plane 34) and radiation scattered but target 24 is collected along directions at an oblique angle to the target and the reference plane. Alternatively, target 24 may be illuminated by radiation directed at oblique angles to the target instead of from an overhead position, and radiation from the illumination beam scattered by the target may be collected in directions normal to or near normal to the overlay target and reference plane 34. This configuration is illustrated in FIG. 5 in system 50.

In reference to FIGS. 1 and 5, the array 32 is preferably a two-dimensional array of detectors, such as charge-coupled devices (CCDs). A grating such as that shown in FIG. 3A is present on the current layer and another grating is present on the previous layer. Misalignment between the two gratings may be determined by cross-correlating intensities of the radiation in the two-dimensional image detected from one grating with the intensities of the radiation in the two-dimensional image detected from the other grating. This may be done by computer 40 of FIGS. 1 and 5 by cross-correlating the two-dimensional images of the two gratings. Alternatively, to improve signal-to-noise ratio, a one-dimensional signal may be first formed from the two-dimensional image of each of the two gratings by means of computer 40. For example, this may be performed by obtaining an average of the intensities in the image along the Y direction (i.e. along the direction of the grating lines). Thus, the one-dimensional signal would then be a function of x and it may have the waveform shown in FIG. 3B. By averaging along the direction of the grating lines, namely Y, the signal-to-noise ratio is improved by the square root of the number of lines over which the averaging is performed. Then the cross-correlation is performed between the averaged intensities along the Y axis of the radiation in the two-dimensional image detected from one grating with the averaged intensities also along the Y axis of the radiation in the two-dimensional image detected from the other grating. The two averaged signals are also illustrated in FIG. 10 described below. As described in more detail below, the mis-alignment between the two gratings can be found by calculating the phase difference between the two averaged signals. Preferably, the cross-correlation is performed on intensities of the radiation detected from adjacent lines of the two gratings across at least two or more of the lines of each of the gratings. Thus if the illuminated portions of the two gratings cover enough lines of the two gratings for the cross-correlation to yield adequate information to find the phase difference between the two averaged signals, then the information from the illuminated portions is enough for overlay error determination without having to illuminate the entire extent of the two gratings.

In a similar manner, signal averaging may be performed on images of structures containing boxes or bars also along the direction of the edges in such structures to improve signal-to-noise ratio.

Where beam 22 is a laser beam, speckle is produced along the specular reflection direction. For this reason, where beam 22 is a laser beam, it is preferable for the collection optics to collection radiation only along directions away from the specular reflection direction of the laser beam with respect to the reference plane. This is accomplished in FIG. 1 by stopper 26 and in FIG. 5 by the locations of mirrors 26' away from the normal reflection direction in FIG. 5.

As noted above, conventional systems employ collection optics having high numerical apertures. For this reason, it will be difficult to focus radiation from the two structures at different elevations to the same detector. According to another aspect of the invention, two apertures are employed at locations that are at different distances from the reference plane 34. Radiation scattered by one grating at a lower elevation is focused by the collection optics to a first aperture and radiation from the other grating at a high elevation is focuses by the same or different collection optics to the other aperture. One or more detectors may be placed behind the two apertures. With such arrangement, it is possible for scattered radiation from both structures at different elevations to be focused at the same time to their respective apertures or slits. This configuration is illustrated in FIG. 6A. FIG. 6B is a side view of the system 70 of FIG. 6A.

Thus, radiation scattered by grating 24(1) is collected and focused by lenses 28, 30 to slit 72 and radiation scattered by grating 24(2) is collected and focused by lenses 28, 30 to slit 74. As shown in FIG. 6A, slit 72 is closer to reference plane 34 than slit 74, where the difference in the distances between the two slits from reference plane 34 compensates for the difference between the elevations of the two gratings 24(1), 24(2). In this manner, one does not have to compromise resolution in order to relax the requirement for depth of focus.

Since the scattered radiation by the two gratings need to be focused to two different slits, not the entire gratings will be illuminated and beam 22' has a small beam diameter to illuminate a large spot, where the large spot includes portions of both gratings. Thus, radiation scattered by the illuminated portion of each of the two gratings is collected and focused by the two lenses to its respective slits or aperture. Therefore, in order to scan the two gratings, relative motion between the two gratings and the collection optics (lenses 28, 30 and slits 72, 74) is provided in a conventional manner, such as by using a motor to perform linear translation and/or rotation of the optics or the gratings. The motor has been omitted to simplify the figures. Where mirror 26, lenses 28, 30 and slits 72, 74 are in the same optical head, relative motion may be caused between these elements in the optical head and the two gratings. After images of the two structures are acquired, cross-correlation of the two-dimensional images of the two gratings or one dimensional signals derived there from as described above may be performed by computer 40. The system of FIGS. 6A, 6B may also be used for detecting overlay errors of targets having box and bar type structures thereon.

As described above, the above-described systems may be integrated into semiconductor wafer processing equipment such as lithographic track, stepper and/or etchers. In such event, it will be desirable to control the duration of data collection so that the overlay error detection is less affected by the vibrations caused by the processing equipment. In one embodiment, the integration time of a detector used (such as two-dimensional CCD detectors) is less than about 10 milliseconds. In other words, where beam 22 supplies radiation continually or as radiation pulses having long pulse widths to the target, by choosing a short enough integration time compared to the periods of the vibrations for the detector(s), the error detection will be less affected by the vibrations of the processing equipment. Alternatively, instead of controlling the integration time of detector(s), where beam 22' comprises pulses, the pulse width(s) of the pulses so applied may be less than about ten milliseconds, so that the integration time of the detector(s) may be longer then ten milliseconds. The above-described feature of controlling the duration of data collection may be advantageously combined with collection optics having an appropriate numerical aperture such as one of values described above, to provide accurate overlay error detection capability when integrated with semiconductor wafer processing equipment.

FIG. 7 is a schematic view of a bright field system to illustrate another embodiment of the invention. As shown in FIG. 7, a polychromatic beam 83 is supplied by a CW lamp source 82 which may include a fiber bundle for transmitting radiation from the source. The beam passes through a condenser 84, is reflected by a beam splitter 86 and focused by a microscope objective 88 to reference plane 34 to target 24. Radiation from the beam 83 scattered by target 24 is collected by objective 88, passes through beam splitter 86, and is focused by tube lens 90 to CCD camera 92. As shown in FIG. 7, beam 83 is substantially normal to the reference plane 34, and radiation collected by objective 88 and focused by lens 90 to camera 92 is along directions that are normal or near normal to reference plane 34. Since the radiation collected and focused to the CCD camera 92 includes that along directions normal or near normal to the reference plane 34 for the target, system 80 is a bright field system. System 80 is advantageous over that described in U.S. Pat. No. 6,023,338 in that no scanning of the two gratings in target 24 is required. Beam 83 illuminates a substantial portion of both gratings, or preferably the entire extent of the two gratings, so that a single measurement is adequate for determining any overlay errors between the two gratings. Other advantages of a system without moving parts such as 80 are described above and need not be repeated here. Preferably the collection optics comprising objectives 88, 90 have a medium numerical aperture (which may be a value in any one of the ranges of values for numerical aperture described above) so that it is more likely that radiation from structures at different elevations may be accurately measured in one measurement as described above for dark field systems.

Objective 88 may be a bright field or a bright and dark field objective, depending on its numerical aperture. A Nomarski type objective may also be used, such as that described in G. Nomarski, "Microinterferometre differentiel a ondes polarisés," *J. Phys. Radium* 16, 9S-13S (1955).

Another aspect of the invention is related to methods for processing the image obtained using the systems such as those shown in FIGS. 1, 5, 6A, 6B and 7 to provide more accurate overlay error measurement. This is illustrated in FIG. 8 in another embodiment of the invention. As shown in FIG. 8, overlay target 102 (having two or more structures thereon which may include gratings, boxes and/or bars), is detected using any one of the above-described optical tools 104 to obtain a two-dimensional digital image 106. The digital image 106 is then supplied to an image pre-processing tool 108 such as processor 40 to obtain a one-dimensional signal 110, such as by averaging the two-dimensional image intensities along the direction of an edge in a grating, box or bar as described above. A model is then constructed using parameters in a parameter space. The values of these parameters are then varied to fit the model to the one-dimensional signal derived from the two-dimensional digital image using a non-linear regression tool (block 112) applied through a processor. By finding the best-fit values of the parameters of the pre-defined model to the one-dimensional signal (block 114), these parameters are then analyzed (block 116) to find the value of overlay error or other errors (block 118). While it is preferable to derive a one dimensional signal from the two dimensional image before performing the nonlinear regression, it will be understood that it is also possible to perform nonlinear regression on the two dimensional image without deriving first a one dimensional signal; all such and other variations are within the scope of the invention.

As noted above, conventional algorithms utilize only data at or near the edge portion of the two-dimensional image of a box-in-box target or other targets involving boxes and bars. The data points in other parts of the image are not utilized. Another aspect of the invention is directed towards the recognition that by utilizing more data points from the two-dimensional image than conventional methods, a more accurate result can be obtained. In one embodiment, this is achieved by finding at least one analytical function of position in the image to represent the two-dimensional digital image.

In this embodiment, a model utilizing an analytical function is first constructed where the function is expressed in terms of a number of parameters. Non-linear regression is then performed to find the values of the parameters that would result in the best fit of the function to the experimental data. These parameter values are then used to derive the overlay errors and other errors.

A preferred process for implementing the above-described features such as deriving a one-dimensional signal from a two-dimensional image and nonlinear regression is described below.

Noise Reduction Procedure

The two-dimensional image obtained as described above may be first pre-processed to select the image region for further analysis, such as done by detecting the outer edges of the target. The two-dimensional image preferably is also pre-processed to average out random noise and obtain a one-dimensional signal suitable for calculating the overlay error along the x and Y axis of the two dimensional image according to the two equations below:

$$I_x(x_i) = \frac{1}{N_y} \sum_{j=1}^{N_y} I(x_i, y_j) \quad (1)$$

$$I_y(y_j) = \frac{1}{N_x} \sum_{i=1}^{N_x} I(x_i, y_j) \quad (2)$$

where $I(x_i, y_j)$ is the image intensity at a pixel characterized by the coordinates $(x_i, y_j)$, and $N_x, N_y$ stand for the number of pixels in the X and Y directions respectively in the selected image region.

Both equations (1) and (2) are used for targets having boxes and/or bars therein, while only equation (1) is used for grating targets where the averaging is done along the direction of grating lines only.

The above two equations are used under the assumption of a perfect alignment of target edges along the axes X and Y. If mis-alignment in the hardware becomes an issue, a similar averaging is performed along the axes X' and Y' which are rotated with respect to the original axes X and Y by an angle $\theta$. The angle $\theta$ is then added to a set of adjustable parameters in a non-linear regression tool described below.

Model for Grating Targets

After pre-processing of the two-dimensional grating image, the one-dimensional signal such as that in equation (1) above is obtained. The overlay error $\delta x$ may then be found from phase shift $\delta\phi$ and the pitch p of two one-dimensional periodic signals of the form:

$$\delta x = \frac{p}{2\pi} \delta\varphi \quad (3)$$

FIG. 9 is a plot of a two-dimensional image of four gratings, two gratings 132, 134 on a first layer of the target and two gratings 136, 138 on a second layer of the target at an elevation different from that of the first layer. In other words, FIG. 9 is an example of the graphical plot of image $I(x_i, y_j)$ of the four gratings in equations (1) and (2) above.

Since the pair of gratings 132, 134 are at an elevation different from that of pair of gratings 136, 138, the pitches of the two pairs of gratings may be different in the two-dimensional image even though they may be fabricated with the same settings for pitch. For this reason, according to the model referred to above, two one-dimensional periodic signals are generated at two different pitch values $p_1$ and $p_2$.

For each periodic signal, it is analyzed by its Fourier series with a finite number N of terms, where the series is of the following form:

$$I_x(x) = (a_0/2) + \sum_{n=1}^{N} a_n \cos\frac{2\pi n x}{p} + \sum_{n=1}^{N} b_n \sin\frac{2\pi n x}{p} \quad (4)$$

A Fast Fourier Transform (FFT) algorithm is used to approximately estimate the pitch p and the coefficients $a_n$ and $b_n$. Then, a non-linear regression tool is utilized to find the best fit of the model of Equation (4) to the averaged radiation data points obtained from the two-dimensional image for each of the two signals of the form $I_x(x)$. To the extent that the pitches of the two pairs of gratings are different in the two-dimensional image, the above process will result in two different pitch values $p_1$ and $p_2$. These two pitch values are compared to each other and if the difference between them exceeds a specified percentage limit, the target is rejected and no overlay error is returned. Otherwise, the mean pitch value $$p = (p_1 + p_2)/2 \quad (5)$$

is assumed for both signals, and their coefficients $a_n^1$, $b_n^1$, $a_n^2$, $b_n^2$ are further refined with the same nonlinear regression tool as above—here the misalignment angle $\theta$ is included as an adjustable parameter if necessary. If the intensity of the fundamental harmonics (i.e. n=1 in $a_n$ and $b_n$) is strong enough in each signal, the phase shift $\delta\phi$ is obtained from the following equation:

$$\delta\phi = \tan^{-1}(b_1^{\,1}/a_1^{\,1}) - \tan^{-1}(b_1^{\,2}/a_1^{\,2}) \quad (6)$$

Otherwise, the strongest harmonics are used to calculate $\delta\phi$, while the second-strongest harmonics is used to perform phase unwrapping. After the non-linear regression tool is used to find the best fit of the model of Equation 4 to the radiation data points for each of the two signals that represent the two pairs of gratings at different elevations, the two signals are then compared as illustrated in FIG. 10 to find the phase difference between them. As shown in FIG. 10, one of the two signals is shown as a solid line and the other signal is shown as a broken line. This is performed by substitution of equations (5) and (6) into equation (3) above, which yields the value of overlay error $\delta x$ that is returned as the measurement result.

Where the noise reduction algorithm of equations (1) and (2) has not been applied to the two-dimensional image, the above-described process for finding the best fit of the model to the data points in the radiation of the two-dimensional image is still possible. For example, the model of equation (4) may be used to find the best fit to radiation data points obtained along a cross-section along a plane transverse to the grating lines of the two-dimensional image.

Modeling for Targets that Include Box(es) and/or Bar(s)

FIG. 11 is an image of a two-dimensional box-in-box type target useful for illustrating the invention. As in the case of the two-dimensional image of a grating target, two one-dimensional signals may be derived from the two-dimensional box-in-box image as shown in FIG. 11. For example, the averaging process set forth in Equations (1) and (2) above may be applied to sections of the image in FIG. 11. Thus, the averaging may be performed on the top and bottom portions 142, 144 of the outer box 140 between the dotted lines 152, 154 and performed on the inner box 150 along the X direction. Similarly, averaging of the image may be performed on the left and the right portions 146, 148 of the outer box 140 between dotted lines 156, 158 as well as for the inner box 150 along the Y direction. The above-described process yields two one-dimensional signals, also in accordance with Equations (1) and (2) above, except that the averaging is performed only on portions 142, 144, 146, 148 of the outer box and the inner box of the two-dimensional image of FIG. 11.

FIG. 12 illustrates graphically an example of the shape of each of the two one-dimensional signals so derived. Similarly, by averaging in the Y direction of the inner box 150 and sections of the left and right portions 146, 148 between dotted lines 156, 158, a one-dimensional signal of the form shown in FIG. 12 is obtained as well. As will be described below, a model utilizing parameters is created for the box-in-box image. By fitting the model to the one-dimensional data along both the X and Y axes such as illustrated in FIG. 12, the centers of the outer and inner boxes can be found.

As noted above, one aspect of the invention is based on the recognition that, unlike conventional systems, by using radiation data not only at the edge portions but also at other portions of the two-dimensional image, a more accurate result can be obtained. In other words, in addition to utilizing the radiation data at or near the peaks 142a, 142b, 150a, 150b, 144a, 144b, the system of this invention utilizes also the radiation data at other portions of the radiation image, such as data points at portions 162, 164 and 166 in FIG. 12. This is accomplished in the system of this invention by an edge detection model in the form of an analytical function. In one embodiment, an edge analytical function that is to be fitted to the one-dimensional data derived from the two-dimensional image is as follows:

$$f(x) = \begin{cases} A_1 + \dfrac{B}{1+[(x-x_0)/d_1]^2}, & x < x_0 \\ A_2 + \dfrac{B+(A_1-A_2)}{1+[(x-x_0)/d_2]^2}, & x > x_0 \end{cases} \quad (7)$$

in the above Equation, $A_1$, $A_2$, B, $d_1$, $d_2$ and $x_0$ are parameters that can be varied to fit the edge function to the data points in the one-dimensional signal such as that shown in FIG. 12. The edge occurs at position $x_0$ along the X axis. By substituting y for x, an edge function $f(x)$ similar in form to Equation (7) above may be used for the average profile of an edge along the Y axis, where $x_0$ is replaced by $y_0$ representing the position of the edge along the Y axis. Since the range of values of x in Equation (7) above covers data points in portions 162, 164 and 166, the data points in these portions are also utilized in the curve fitting process to be described below.

In the above embodiment, an average one-dimensional signal is derived from the two-dimensional image for each of the X and Y axis. The averaging reduces the effects of noise and improves signal-to-noise ratio. Alternatively, instead of performing an averaging process to obtain the one-dimensional signals $f(x)$, $f(y)$ as described above, these functions can be obtained by simply taking the data falling along a cross-section of the outer and inner boxes, such as the data falling along the cross-section along dotted lines 172, 174 in FIG. 11. It was found that similar performance of overlay error measurement can be achieved by more than one analytical edge model, such as the model of Equation (7). These alternative models include a model involving exponential or Gaussian functions, and the exact model obtained by convolving the box with the point-spread function of the optical system. Such and other variations are within the scope of the invention.

In targets where the edges of the inner and outer boxes are close together, the signal such as that in FIG. 12 indicative of the edges of the outer box contains contribution from radiation scattered by the inner box and vice versa. In conventional systems, this can lead to systematic errors in overlay calculation. To overcome this problem, the total signal from the two boxes is represented as the sum of two contributions from the inner and outer boxes (or bars for bar-in-bar targets):

$$I_x(x) = I_x^{inn}(x) + I_x^{out}(x) \quad (8)$$

The functions $I_x^{inn}(x)$ and $I_x^{out}(x)$ are built from simple analytic segments modeling the box edges, such as the edge functions in Equation (7) above. The total signal may be constructed in a similar manner for box-in-bar or bar-in-box targets.

The result of using Equations (7) and (8) as a model for the box edges and other portions of the boxes was found to yield overlay precision and accuracy as good as the one obtained from using the exact function obtained by convolving the box with the point-spread function of the optical system. To minimize the effects of tool induced shift ("TIS") and non-uniform illumination and to reduce the number of adjustable parameters, the signal $I_x^{out}(x)$ for the outer box is obtained by a superposition of two functions $f(x)$ reflected with respect of each other with respect to the outer box center with coordinate $x_c^{out}$.

$$I_x^{out}(x) = g(x - x_c^{out}) + g(x_c^{out} - x) \quad (9)$$

where the function g(x) is a sum of two edge functions $f(x)$, as illustrated in FIG. 14. The TIS process is more fully explained in "Lithography Process Control," by Harry Levinson SPIE press, vol. TT28, Bellingham, Wash. 1999. This construction reflects the fact that the signal $I_x^{out}(x)$ is formed due to the same material; hence it corrects for illumination and TIS effects, since it is more sensitive to the target properties rather than to illumination properties or optical tool properties. The signal for the inner box $I_x^{inn}(x)$ is constructed using only one function $f(x)$ centered at the point $x_c^{inn}$:

$$I_x^{inn}(x) = f(x - x_c^{inn}) + f(x_c^{inn} - x) \quad (10)$$

where the adjustable parameters for the inner box edge functions $f(x)$ in this equation are different from the adjustable parameters for the outer box edge functions. The symmetrization used in this equation is important to reduce the number of adjustable parameters and improve measurement performance, as explained in the discussion for the outer box.

Then a nonlinear regression tool is used to find the best fit of the model (8) to the experimental signal and calculate the overlay error from:

$$\delta x = x_c^{out} - x_c^{inn} \quad (11)$$

In another embodiment of this invention, instead of using one-dimensional signals obtained by averaging the two-dimensional data, the entire two-dimensional image is modeled such as illustrated in FIG. 11 by an analytical function of x and y. Instead of Equation (8) we then have $$I(x,y)=I^{inn}(x,y)+I^{out}(x,y) \tag{12}$$

where $I^{inn}(x,y)$ and $I^{out}(x,y)$ are analytical models for the inner and outer box images. As in the one-dimensional case described above, different implementations of these models are possible, including combinations of rational functions (as in Equation (7)), exponential functions, and the convolution of the object with the point spread function of the optical system.

FIG. 13 is a graphical illustration of the function $f(x)$ in Equation (7) above for describing the edge in box-in-box or bar-in-bar, or box-in-bar image. The parameters $d_1$ and $d_2$ in Equation (7) denote the decay rate of the peak intensity at the edge of the box or bar to the left and to the right of the coordinate $x_0$, respectively. In other words, peak 200 indicates the presence of an edge of a box or a bar. The portion 202 indicates the intensities of radiation detected from an elevated portion of the box or the bar and portion 204 indicates the intensities of radiation detected from a non-elevated portion of the target outside the box or the bar.

Next the two-edge function $g(x)$ is built as a sum of two functions $f(x)$ with different set of parameters. Some constraints on parameter are introduced to obtain a meaningful, continuous function. It is assumed, e.g., that the parameter $A_2$ of the first edge function equals the parameter $A_1$ of the second function. FIG. 14 is a graphical plot of the function $g(x)$ in Equation (9) according to the model.

In Equation (9), the outer box signal is formed by adding two functions $g(x)$ reflected with respect to the center of the outer box $x_c^{out}$—this center becomes another adjustable parameter to determine. For the inner box, a similar symmetric superposition of two functions $f(x)$ is taken so that the signal looks symmetric (unlike the one in FIG. 14). The adjustable parameter for the inner box will be the parameters that enter the $f(x)$ function and the symmetrization center $x_c^{inn}$—this is the center of the inner box that is also to be determined by nonlinear regression for later use in Equation (9).

Many of the box-in-box and bar-in-bar and box-in-bar type targets include structures that are symmetrical about the center of the segments of the box or bar structures. For example, in reference to FIG. 11, the edge function representing portion 142, for example, should be symmetrical about the dotted line 190 which divides portion 142 into two equal halves. For this reason, it is preferable for the outer box and the inner box signals to be formed by adding Integrated Wafer Processing and Overlay Error Detection Tool:

FIG. 15 is a block diagram of an overlay error detection system 10, a photolithographic track, stepper and an etcher to illustrate another aspect of the invention. A layer of material such as photoresist is formed on the surface of a semiconductor wafer by means of stepper 350, where the photoresist forms a grating structure on the wafer. Overlay errors of the grating structures are then measured using the systems of FIGS. 1, 5, 6A, 6B, 7 and one or more of the above-described techniques. Such measurements from the computer 40 are then fed back to stepper 350, where such information may be used to alter the lithographic process in stepper 350 to correct any errors.

In semiconductor processing, after a layer of photoresist has been formed on the wafer, an etching process may be performed, such as by means of etcher 360. The layer of photoresist is then removed in a manner known in the art and the resulting grating structures made of semiconductor material on the wafer may again be measured if desired using the above-described systems. The overlay error value(s) measured prior to the etching process using any one or more of the above-described techniques may be supplied to the etcher for altering any one of the etching parameters in order to correct any errors that have been found using the systems. Of course the results obtained by one or more of the above described techniques may be used in both the stepper and the etcher, or in either the stepper or the etcher but not both. The stepper 350 and/or etcher 360 may form an integrated single tool with any one of the above-described systems for finding the one or more parameters of a diffracting structure, or may be separate instruments from it.

Software Upgrades:

The invention has been described above, employing a system such as that shown in FIGS. 1, 5, 6A, 6B or 7. While the various optical components in the system of these figures are used to obtain measured data from the sample, many of the other processes are performed by computer 40. Thus, for many systems currently being used by manufacturers such as semiconductor manufacturers, the computers used in the systems may not have the capability to perform the techniques described above. Thus, another aspect of the invention envisions that the software in these computers can be upgraded so that computer 40 can perform one or more of the above described different functions. Therefore, another aspect of the invention involves the software components that are loaded to computer 40 to perform the above-described functions. These functions, in conjunction with the optical components of the systems in FIGS. 1, 5, 6A, 6B, provide results with the different advantages outlined above. The software or program components may be installed in computer 40 in a variety of ways.

As will be understood in the art, the inventive software components may be embodied in a fixed media program component containing logic instructions and/or data that when loaded into an appropriately configured computing device to cause that device to perform according to the invention. As will be understood in the art, a fixed media program may be delivered to a user on a fixed media for loading in a users computer or a fixed media program can reside on a remote server that a user accesses through a communication medium in order to download a program component. Thus another aspect of the invention involves transmitting, or causing to be transmitted, the program component to a user where the component, when downloaded into the user's device, can perform any one or more of the functions described above.

FIG. 16 shows an information appliance (or digital device) that may be understood as a logical apparatus that can read instructions from media 417 and/or network port 419. Apparatus 40 can thereafter use those instructions to direct server or client logic, as understood in the art, to embody aspects of the invention. One type of logical apparatus that may embody the invention is a computer system as illustrated in 40, containing CPU 404, optional input devices 409 and 411, disk drives 415 and optional monitor 405. Fixed media 417 may be used to program such a system and may represent a disk-type optical or magnetic media, magnetic tape, solid state memory, etc. One or more aspects of the invention may be embodied in whole or in part as software recorded on this fixed media. Communication port 419 may also be used to initially receive instructions that are used to program such a system to perform any one or more of the above-described functions and may represent any type of communication connection, such as to the internet or any other computer network. The instructions or program may be transmitted directly to a user's device or be placed on a network, such as a website of the internet to be accessible through a user's device. All such methods of making the program or software component available to users are known to those in the art and will not be described here.

The invention also may be embodied in whole or in part within the circuitry of an application specific integrated circuit (ASIC) or a programmable logic device (PLD). In such a case, the invention may be embodied in a computer understandable descriptor language which may be used to create an ASIC or PLD that operates as herein described.

While the invention has been described above by reference to various embodiments, it will be understood that changes and modifications may be made without departing from the scope of the invention, which is to be defined only by the appended claims and their equivalents. All references mentioned herein are incorporated in their entirety.

What is claimed is:

1. An imaging method for detecting misalignment of two structures placed next to each other with respect to a reference plane, comprising:
    providing a beam of radiation to illuminate the two structures;
    collecting radiation from the two structures and directing the collected radiation to form an image of the two structures on an array of detectors from intensities of the collected radiation, each of the detectors detecting radiation originating from a corresponding portion of the image, causing said array of detectors to provide two sets of outputs, each set containing a plurality of outputs provided in response to and corresponding to radiation collected from a plurality of different portions of a corresponding one of the two structures, wherein said collecting collects radiation from the structures only along one or more directions away from any specular reflection direction(s) of the beam; and
    determining a misalignment between the two structures from the two sets of outputs.

2. The method of claim 1, wherein said providing provides a beam of radiation that illuminates the entire extent of both structures simultaneously.

3. The method of claim 1, each of said structures comprising an array of lines, said method further comprising summing the outputs of the detectors detecting radiation imaged onto the detectors from a line of one of the structures.

4. The method of claim 1, wherein said beam of radiation is provided to illuminate two structures formed on a substrate from two consecutive processes.

5. The method of claim 1, wherein said providing provides a beam of radiation so that the beam illuminates the structures along directions that are substantially normal or near normal to the reference plane.

6. The method of claim 1, wherein said providing provides a beam of radiation so that the beam is at an oblique angle to the reference plane.

7. The method of claim 1, wherein said providing provides a laser beam or a broadband beam having multiple wavelengths.

8. The method of claim 1, further comprising:
    determining a misalignment between the structures from a phase difference between the two sets of outputs of the detectors.

9. The method of claim 1, said array of detectors providing intensities of the collected radiation as a function of position along the two structures.

10. The method of claim 5, wherein the collecting collects radiation from the two structures along directions at oblique angles to the reference plane.

11. The method of claim 6, wherein the collecting collects radiation from the two structures along directions that are substantially normal or near normal to the reference plane.

12. The method of claim 7, wherein said providing provides a laser beam and said collecting collects radiation only along directions away from a specular reflection direction of the laser beam with respect to the reference plane.

13. The method of claim 9, each of said structures comprising an array of lines, said intensities of the collected radiation being provided as a function of position along a direction transverse to the lines.

14. The method of claim 8, wherein said determining includes finding a phase difference between outputs of the detectors.

15. The method of claim 8, said two structures being periodic substantially along a direction, wherein said determining includes cross-correlating intensities of the radiation detected from adjacent lines of the two structures across at least two or more of the lines of each of the structures.

16. The method of claim 8, wherein information relating to said misalignment is provided to a stepper or etcher.

17. The method of claim 8, further comprising providing information relating to said misalignment for altering a semiconductor manufacturing process.

18. An imaging apparatus for detecting misalignment of two structures placed next to each other with respect to a reference plane, comprising:
    a source providing a beam of radiation illuminating the two structures;
    an array of detectors;
    optics collecting radiation from the two structures and directing the collected radiation to form images of the two structures from intensities of the collected radiation on the array of detectors which provide outputs, each of the detectors detecting radiation originating from a corresponding portion of the images, causing said array of detectors to provide two sets of outputs, each set containing a plurality of outputs provided in response to and corresponding to radiation collected from a plurality of different portions of a corresponding one of the two structures, said optics positioned to collect radiation only along directions away from a specular reflection direction of the beam with respect to the reference plane; and
    a processor determining a misalignment between the structures from a phase difference between the two sets of outputs of the detectors.

19. The apparatus of claim 18, wherein said array includes a two dimensional array of detectors.

20. The apparatus of claim 18, wherein said source provides a beam of radiation that illuminates the entire extent of both structures simultaneously.

21. The apparatus of claim 18, each of said structures comprising an array of lines, said processor summing the outputs of the detectors detecting radiation imaged onto the detectors from a line of one of the structures.

22. The apparatus of claim 18, said two structures being periodic substantially along a direction, wherein said processor cross-correlates intensities of the radiation detected from adjacent lines of the two structures across at least two or more of the lines of each of the structures.

23. The apparatus of claim 18, said detectors having an integration time less than about 10 milliseconds.

24. The apparatus of claim 18, wherein said source provides a beam of radiation so that the beam illuminates the structures along directions that are substantially normal or near normal to the reference plane.

25. The apparatus of claim 18, wherein said source provides the beam so that the beam is at an oblique angle to the reference plane.

26. The apparatus of claim 18, wherein said source provides a laser beam or a broadband beam having multiple wavelengths.

27. The apparatus of claim 18, said array of detectors providing intensities of the collected radiation as a function of position along the two structures.

28. The apparatus of claim 18, wherein said optics includes a refractive element that directs radiation from the source to the two structures and that collects radiation from the two structures.

29. The apparatus of claim 24, wherein the optics collects radiation from the two structures along directions at oblique angles to the reference plane.

30. The apparatus of claim 25, wherein the optics collects radiation from the two structures along directions that are substantially normal or near normal to the reference plane.

31. The apparatus of claim 26, wherein said source provides a laser beam and said optics collects radiation only along directions away from a specular reflection direction of the laser beam with respect to the reference plane.

32. The apparatus of claim 27, each of said structures comprising an array of lines, said intensities of the collected radiation being provided as a function of position along a direction transverse to the lines.

33. The apparatus of claim 28, wherein said two structures are at different distances from the optics, said refractive element having a numerical aperture in the range of about 0.1 to 0.9.

34. The apparatus of claim 33, said refractive element having a numerical aperture in the range of about 0.4 to 0.8.

35. The apparatus of claim 34, said refractive element having a numerical aperture in the range of about 0.5 to 0.7.

* * * * *